United States Patent
Erbkamm et al.

(10) Patent No.: US 6,942,768 B2
(45) Date of Patent: Sep. 13, 2005

(54) VACUUM COATING APPARATUS

(75) Inventors: Wolfgang Erbkamm, Dresden (DE); Hans-Christian Hecht, Weinböhla (DE); Michael Hofmann, Dresden (DE); Falk Milde, Dresden (DE)

(73) Assignee: Von Ardenne Anlagentechnik GmbH, Dresden (DE)

( * ) Notice: Subject to any disclaimer, the term of this patent is extended or adjusted under 35 U.S.C. 154(b) by 0 days.

(21) Appl. No.: 10/259,973

(22) Filed: Sep. 27, 2002

(65) Prior Publication Data

US 2003/0057090 A1 Mar. 27, 2003

(30) Foreign Application Priority Data

Sep. 27, 2001 (DE) ......................................... 101 47 708

(51) Int. Cl.$^7$ ........................... C23C 14/35; C23C 16/00
(52) U.S. Cl. ............................ 204/298.24; 204/298.25; 118/718
(58) Field of Search ................... 204/298.24, 298.25; 118/718, 719

(56) References Cited

U.S. PATENT DOCUMENTS

| | | | |
|---|---|---|---|
| 4,204,942 A | 5/1980 | Chahroudi | 204/298 |
| 4,298,444 A | 11/1981 | Chahroudi | 204/192 |
| 4,692,233 A * | 9/1987 | Casey | 204/298.25 |
| 5,328,813 A * | 7/1994 | Strandjord et al. | 430/321 |
| 6,204,480 B1 | 3/2001 | Woodard et al. | 219/203 |

FOREIGN PATENT DOCUMENTS

DE  19735603  11/1998

OTHER PUBLICATIONS

Copy of catalog "Sputter Web Coaters".

* cited by examiner

Primary Examiner—Rodney G. McDonald
(74) Attorney, Agent, or Firm—Baker Botts L.L.P.

(57) ABSTRACT

A system for coating band-shaped material, where the band-shaped material travels through at least one process chamber in which there is a vacuum, and at least one cooling roller. On the peripheral surface of each cooling roller are at least two magnetron sputter sources that are arranged separate from one another in magnetron chambers, which are formed by separate magnetron chamber walls and allow each chamber to be evacuated, so the pressure in the magnetron chamber can be maintained higher than that in the process chamber. The magnetron chamber walls and the magnetron sputter sources can be mounted on a common carriage, which is displaceable parallel to the cooling roller axis. The result is the reduction in the maintenance costs in cleaning of the magnetron chamber walls and at the same time improvement of the separation of gas between the magnetron chambers and the process chamber.

8 Claims, 1 Drawing Sheet

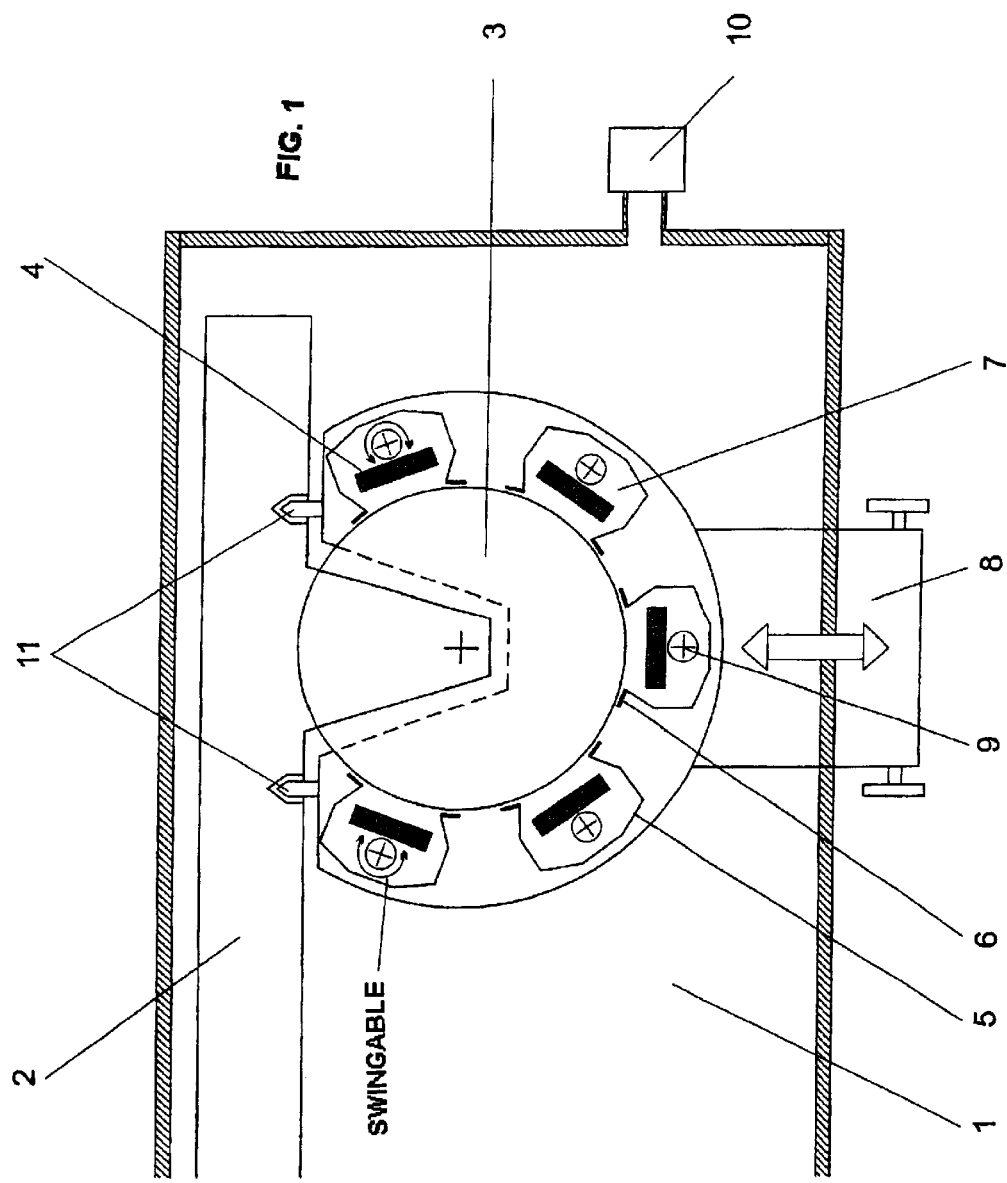

VACUUM COATING APPARATUS

FIELD OF THE INVENTION

The present invention generally relates to a vacuum coating system for coating band-shaped material in a process chamber. In the process chamber are arranged an unwinding means and a winding means, between which the band-shaped material to be coated travels. The band-shaped material travels through at least one process chamber in which there is a vacuum, and the process chamber is arranged so that there is at least one cooling roller. On the peripheral surface of the cooling roller is located at least two magnetron sputter sources that are arranged separate from one another in magnetron chambers.

BACKGROUND OF THE INVENTION

A vacuum coating system for band-shaped materials consisting of two process chambers has been previously described in German Patent DE 19,735,603 C1. In each process chamber is a roller frame in which a guide means and a cooling roller are carried. Depending upon the process technology, each process chamber is divided into various magnetron chambers by magnetron chamber walls. The magnetron chamber walls are detachably connected to the process chamber walls and are arranged at a specified distance from the associated cooling roller. At least one magnetron sputter source used for coating the band-shaped material is arranged in these magnetron chambers. All the magnetron sputter sources and the associated magnetron environment of a cooling roller are connected to a displaceable chamber flange allowing it to be moved away from the cooling roller. The vacuum within the magnetron chambers develops essentially due to the vacuum pumps assigned to the respective magnetron chambers in combination with flow resistance seals between the magnetron chamber walls and the cooling roller.

During the coating of band-shaped material, undesirable coating of the magnetron chamber walls develops and therefore has to be removed from time to time. However, these walls are connected to the process chamber walls. In order to be able to clean the magnetron chamber walls, they must be individually removed from the process chamber resulting in relatively high maintenance costs.

SUMMARY OF THE INVENTION

An objective of the present invention is to reduce maintenance costs in cleaning magnetron chamber walls and at the same time to improve the separation of gases between the magnetron chambers and the process chamber and the separation of gases between magnetron chambers. According to the invention, this object is accomplished in a vacuum coating system by magnetron chambers that are determined by the peripheral surface of the cooling roller and by the magnetron chamber walls. The magnetron chambers partially surround the peripheral surface of the cooling roller and have flow resistance seals and the magnetron chamber walls are completely surrounded outside by the process chamber vacuum and a pressure difference between each magnetron chamber and the process chamber vacuum is adjustable. Thus, the magnetron chamber required for the coating process is designed without a direct connection to the process chamber. Also, the penetration of gas into the magnetron chamber is prevented by adjustment of the pressure difference between the magnetron chamber and the process chamber.

In one preferred embodiment of the invention, it is provided that each magnetron chamber is connected with a separate vacuum generator. For example, either each magnetron chamber has a vacuum generator assigned only to it or all magnetron chambers are connected to a common vacuum generator.

In a further embodiment of the invention, it is provided that the flow resistance seals are capable of being moved away from the cooling roller. This permits movement of the magnetron chambers parallel to the cooling roller axis without damage to the cooling roller peripheral surface, because the distance of the flow resistance seals from the cooling roller surface is increased before displacement of the entire unit.

In a second embodiment of the invention, it is provided that the magnetron chamber walls are fastened at least indirectly to a common carriage, which is displaceable parallel to the axis of the cooling roller. Thus, the magnetron sputter sources, as well as the magnetron chamber walls, can be moved away from the cooling roller for cleaning and/or maintenance purposes, the connections to the vacuum pumps being automatically separated.

In an additional favorable embodiment of the invention, it is provided that the magnetron chamber on one side of the cooling roller axis lies are capable of being swung away from the cooling roller. This increases the distance of the magnetron chambers from the cooling roller, and permits lowering of the entire carriage before it is moved out.

In a third embodiment of the invention, it is provided that the magnetron chambers are capable of being lowered in conjunction with the common carriage. First the magnetron chambers, arranged above the horizontal plane in which the cooling roller axis lies, are swung away from the cooling roller. Then the entire carriage is lowered and can be moved away from the cooling roller.

In a further embodiment of the invention, it is provided that the carriage carrying the magnetron sputter sources and the magnetron chambers is arranged to be adjusted in position with respect to the roller frame. By means of this adjusting arrangement, precise alignment of the magnetron sputter sources and the magnetron chamber walls, including the flow resistance seals, to the respective cooling roller peripheral surface need only be made once and can be reestablished accurately without taking much time.

In an additional embodiment of the invention, it is provided that the process chamber and the magnetron chambers are capable of being evacuated independently.

In a further embodiment of the invention, it is provided that the pressure in the process chamber is lower than the pressure in the magnetron chamber. Separate exhaust of the process chamber and the obtainable pressure relationships between the process chamber and the magnetron chambers ensure qualitatively better gas separation for the respective sputter sources, since penetration of gas into any magnetron chamber is no longer possible.

BRIEF DESCRIPTION OF THE DRAWINGS

The present invention may be better understood with reference to the attached drawings described below:

FIG. 1 illustrates a basic representation of a process chamber coating apparatus in accordance with one embodiment of the invention.

DETAILED DESCRIPTION OF THE INVENTION

In the present invention the process chamber 1 of the vacuum coating system is arranged with a roller frame 2, on which a cooling roller 3 having a peripheral surface is mounted. Magnetron sputter sources 4 are arranged at various positions around the cooling roller peripheral surface. In order to be able to evacuate the space between the magnetron sputter source 4 and the cooling roller 3, it is surrounded by a magnetron chamber wall 5, which is sealed off from the cooling roller 3 by flow resistances 6, thus forming individual magnetron chambers 7. These magnetron chambers 7 have, at a front end, a connection 9 to each vacuum pump, which is not represented here. The magnetron chambers 7 can thus be separated and evacuated independently of one another.

Likewise connected to the process chamber 1 is a vacuum pump 10, through which evacuation of the process chamber 1 takes place independent of the magnetron chambers 7. To prevent process gas intake into the magnetron chambers 7, a higher pressure is established in the magnetron chambers 7 than in the process chamber 1 and thus prevents penetration of foreign gas into a magnetron chamber 7.

All magnetron sputter sources 4 and the magnetron chambers 7 may be fastened to a common carriage 8, through which they can be moved away from the associated cooling roller 3. For this purpose, the flow resistance seals 6 of all magnetron chambers 7 can be moved away from the cooling roller 3. The swingable magnetron chambers 7 arranged on one side of the cooling roller axis may be swung away from the cooling roller 3 and the entire carriage 8 is lowered. These preparatory measures prevent damage to the cooling roller peripheral surface when the carriage 8 moves out in the direction of the roller axis. The magnetron sputter sources 4 and the magnetron chambers 7, including the flow resistance seals 6, must be precisely positioned with respect to the cooling roller axis. An adjusting means 11 is used in order to reestablish the precise position, established before the carriage 8 moves out, without taking additional time.

While there have been described what is believed to be the preferred embodiment of the invention, those skilled in the art will recognize that other and further changes and modifications may be made thereto without departing from the spirit of the invention and it is intended to claim all such changes and modifications as fall within the true scope of the invention.

We claim:

1. Apparatus for vacuum coating a band of material, comprising:

a process chamber;

a cooling roller for transporting said band of material within said process chamber, said cooling roller having an axis for rotation and a peripheral surface wherein said process chamber includes a first vacuum source connection;

at least two magnetron chambers arranged adjacent said peripheral surface within said process chamber, said magnetron chambers each including a magnetron sputter source and surrounding walls having flow resistance seals acting with said peripheral surface and forming a closed magnetron chamber with said peripheral surface; and wherein each of said magnetron chambers includes a corresponding vacuum source connection separate from said first vacuum source connection such that a pressure difference between each magnetron chamber and said process chamber is adjustable, and wherein said magnetron chambers are mounted to a common carriage and arranged such that said common carriage and said magnetron chamber will be displaced in a direction parallel to said roller axis.

2. Apparatus as specified in claim 1 further comprising at least one vacuum generator operably coupled to said first vacuum source connection.

3. Apparatus as specified in claim 1 wherein said flow resistance seals are arranged to be moved away from said peripheral surface.

4. Apparatus as specified in claim 1 wherein magnetron chambers arranged on one side of said roller axis are arranged to be swung away from said peripheral surface.

5. Apparatus as specified in claim 1 wherein said carriage is arranged for displacement in a direction transverse to said roller axis to move said magnetron chambers away from said peripheral surface.

6. Apparatus as specified in claim 1 wherein said cooling roller is mounted to a frame and wherein said carriage is arranged to be adjusted in position with respect to said frame.

7. Apparatus as specified in claim 1 wherein there is provided a vacuum generator for said process chamber and at least a second vacuum generator for said magnetron chambers.

8. Apparatus as specified in claim 7 wherein said vacuum generator is arranged to provide a lower pressure in said process chamber than in said magnetron chambers.

* * * * *